US012635474B2

(12) United States Patent
Gao et al.

(10) Patent No.: US 12,635,474 B2
(45) Date of Patent: May 19, 2026

(54) METHOD, ASSEMBLY AND SYSTEM FOR GAS INJECTION AND CONTROL

(71) Applicant: ASM IP Holding B.V., Almere (NL)

(72) Inventors: Peipei Gao, Chandler, AZ (US); Wentao Wang, Chandler, AZ (US); Han Ye, Phoenix, AZ (US); Kai Zhou, Phoenix, AZ (US); Fan Gao, Chandler, AZ (US); Xing Lin, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 452 days.

(21) Appl. No.: 18/238,573

(22) Filed: Aug. 28, 2023

(65) Prior Publication Data

US 2024/0071804 A1      Feb. 29, 2024

Related U.S. Application Data

(60) Provisional application No. 63/402,867, filed on Aug. 31, 2022.

(51) Int. Cl.
| | |
|---|---|
| *H01L 21/687* | (2006.01) |
| *C23C 16/458* | (2006.01) |
| *H10P 14/24* | (2026.01) |
| *H10P 72/00* | (2026.01) |
| *H10P 72/76* | (2026.01) |

(52) U.S. Cl.
CPC ...... *H10P 72/7611* (2026.01); *C23C 16/4585* (2013.01); *H10P 14/24* (2026.01); *H10P 72/0402* (2026.01); *H10P 72/0602* (2026.01)

(58) Field of Classification Search
CPC ......... H01L 21/68735; H01L 21/67017; C23C 16/4585
See application file for complete search history.

(56) References Cited

U.S. PATENT DOCUMENTS

| | | | |
|---|---|---|---|
| 4,846,102 A | 7/1989 | Ozias | |
| 5,134,963 A | 8/1992 | Barbee | |
| 5,441,568 A * | 8/1995 | Cho | C23C 16/4412 |
| | | | 118/728 |
| 6,093,252 A | 7/2000 | Wengert | |
| 7,537,662 B2 | 5/2009 | Soininen | |
| 8,157,916 B2 | 4/2012 | Kim | |
| 2003/0015141 A1* | 1/2003 | Takagi | H01L 21/68735 |
| | | | 118/728 |
| 2003/0049372 A1 | 3/2003 | Cook | |
| 2007/0087533 A1 | 4/2007 | Nishikawa | |
| 2010/0199914 A1 | 8/2010 | Iza | |
| 2017/0253967 A1 | 9/2017 | Mitrovic | |
| 2018/0233327 A1* | 8/2018 | Kalnin | H01L 21/67017 |
| 2021/0388492 A1 | 12/2021 | Corea | |

* cited by examiner

*Primary Examiner* — Joseph A Miller, Jr.
(74) *Attorney, Agent, or Firm* — Snell & Wilmer L.L.P.

(57) ABSTRACT

Methods, systems, and assemblies suitable for gas-phase processes are disclosed. An exemplary assembly includes a susceptor ring and at least one injector tube. The injector tube can be disposed within the susceptor ring to provide a gas to a peripheral region of a substrate. Methods, systems, and assemblies can be used to obtain desired (e.g. composition and/or thickness) profiles of material on a substrate surface.

23 Claims, 8 Drawing Sheets

METHOD, ASSEMBLY AND SYSTEM FOR GAS INJECTION AND CONTROL

CROSS-REFERENCE TO RELATED APPLICATIONS

This application is a nonprovisional of, and claims priority to and the benefit of, U.S. Provisional Patent Application No. 63/402,867, filed Aug. 31, 2022 and entitled "METHOD, ASSEMBLY AND SYSTEM FOR GAS INJECTION AND CONTROL," which is hereby incorporated by reference herein.

FIELD OF INVENTION

The present disclosure generally relates to methods and systems used in the formation of electronic devices. More particularly, the disclosure relates to methods and systems suitable for gas injection during substrate processing.

BACKGROUND OF THE DISCLOSURE

Gas-phase reactors, such as chemical vapor deposition (CVD) reactors and the like, can be used for a variety of applications, including depositing, and etching materials on a substrate surface, and cleaning of a surface of the substrate. For example, gas-phase reactors can be used to deposit epitaxial layers on a substrate to form devices, such as semiconductor devices, flat panel display devices, photovoltaic devices, microelectromechanical systems (MEMS), and the like.

A typical gas-phase epitaxial reactor system includes a reactor including a reaction chamber, one or more precursor and/or reactant gas sources fluidly coupled to the reaction chamber, one or more carrier and/or purge gas sources fluidly coupled to the reaction chamber, a gas injection system to deliver gases (e.g., precursor/reactant gas(es) and/or carrier/purge gas(es)) to the reaction chamber, a susceptor to retain and heat a substrate, and an exhaust source fluidly coupled to the reaction chamber. Further, epitaxial reactor systems can include one or more heaters (e.g., lamps) and/or temperature measurement devices (e.g., a thermocouple).

During deposition, such as epitaxial deposition, and particularly during deposition of doped or multi-component films, it is often desirable to control film properties, such as thickness and composition of a deposition film to a far edge (e.g. the outer about 5% to about 15% of the radius) of a substrate. With typical methods and systems, such control may be difficult. Accordingly, improved methods and systems are desired.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to improved methods and systems suitable for depositing material on a surface of a substrate and/or other processes. While the ways in which various embodiments of the present disclosure address drawbacks of prior systems and methods are discussed in more detail below, in general, various embodiments of the disclosure provide methods and systems that can be used to, for example, deposit epitaxial material in a more controlled manner. For example, exemplary methods can be used to reduce and control roll-up and/or roll-down at the far edge of a substrate while processing the substrate. Examples of the disclosure can provide improved uniformity of film thickness, composition, and/or the like.

As described in more detail below, in accordance with example of the disclosure, gas injection utilizing an injector tube and injector port disposed on a susceptor ring is disclosed. Such gas injection can provide for more control or facilitate obtaining a desired flow profile for a process (e.g. deposition and/or etching) on the outer edges of the substrate where issues like roll-up and roll-down can otherwise occur. Such gas injection can further provide significant advantages in reducing non-uniformity of films deposited or etched and/or provide desired flow profiles.

Examples of the disclosure are conveniently described in connection with formation of epitaxial films, such as silicon germanium films, or other grown or deposited layers. However, unless noted otherwise, examples of the disclosure are not so limited.

In accordance with additional embodiments of the disclosure, a susceptor ring assembly is provided. An exemplary susceptor ring assembly comprises a susceptor ring and at least one injector tube. An exemplary susceptor ring includes a top surface, a bottom surface, a first edge, a second edge, and a susceptor opening at the interior of the susceptor ring. In accordance with examples of embodiments, the first edge can comprise an opening extending to a first injector cavity within the susceptor ring. In accordance with examples of embodiments, the top surface can comprise a first injector port extending from the top surface to the first injector cavity at a first injection angle. The susceptor opening can span between the top surface and the bottom surface. In accordance with additional embodiments, the first injector tube can be at least partially disposed within the first injector cavity.

In accordance with examples of additional embodiments, the first injection angle can be between about 25 degrees and 65 degrees. In accordance with examples of embodiments, the first injector port length is between about 5 millimeters and about 20 millimeters. In accordance with examples of embodiments, the susceptor ring assembly can further comprise a rotatable susceptor at least partially disposed within the susceptor opening. In accordance with examples of embodiments, the first injector tube can comprise a first aperture within a wall of the first injector tube. The first aperture can be in fluid communication with the first injector port. In accordance with examples of embodiments, the aperture can comprise an opening angle that is greater than the first injection angle. In accordance with further exemplary embodiments, the susceptor ring can comprise a second injector cavity and a second injector tube disposed therein. In accordance with examples of embodiments, the first and/or second injector tube can comprise quartz.

In accordance with additional embodiments of the disclosure, a reactor system is provided. The reactor system includes a reactor comprising a reaction chamber and a susceptor ring assembly disposed within the reactor. The susceptor ring assembly can be the same susceptor ring assembly as described above and elsewhere herein.

In accordance with example of embodiments, the reactor system comprises a rotatable susceptor at least partially disposed within the susceptor opening. In accordance with examples of embodiments, the reactor system further comprises a thermocouple disposed within the rotatable susceptor. The thermocouple can be used to measure a temperature of the rotatable susceptor. In accordance with examples of embodiments, the reactor system further comprises an exhaust flange, and wherein a proximal portion of the first and/or a second injector tube is disposed within the exhaust flange. In accordance with examples of embodiments, the reactor system comprises an injection flange, wherein the injection flange introduces gas at a first end of a reaction chamber and wherein a gas inlet of the first injector tube is at a second end of the reaction chamber.

In accordance with examples of embodiments, the reactor system comprises a plurality of injector ports. In accordance with examples of embodiments, the first injector tube comprises a first aperture configured to provide gas substantially perpendicular to a flow of a process gas flowing from a reaction chamber inlet to a reaction chamber outlet. The first aperture can be in fluid communication with the first injector port and the gas inlet of the first injector tube. In accordance with examples of embodiments, the reactor system can further comprise a precursor source in fluid communication with the injection flange and the first injector port for introduction of a precursor to the reaction chamber. Exemplary precursors can include one or more of a silicon-containing precursor, a germanium-containing precursor, a dopant containing precursor and an etchant.

In accordance with additional embodiments of the disclosure, a method is provided. An exemplary method includes providing a substrate within a reaction chamber of a reactor system, wherein the reactor system comprises a susceptor ring assembly as described above or elsewhere herein. In accordance with examples of embodiments, the method further comprises flowing a gas through the first injector tube. The gas can be one or more of a silicon-containing precursor, a germanium-containing precursor, and a dopant containing precursor.

In accordance with examples of embodiments, the method further comprises measuring a temperature of the susceptor (e.g., using one or more of a thermocouple disposed within the susceptor or a pyrometer). In accordance with examples of embodiments, the method can further comprise controlling a flowrate of the gas based on a measured temperature of the susceptor or based on a process temperature. In accordance with further examples of these embodiments, the reactor system can further comprise a precursor, dopant and/or etchant source in fluid communication with the injection flange and the first injector port for introduction of the respective precursor, dopant and/or etchant to the reaction chamber, and the method can further comprise flowing the respective precursor, dopant and/or etchant into the reaction chamber through the injection flange and the injection port.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
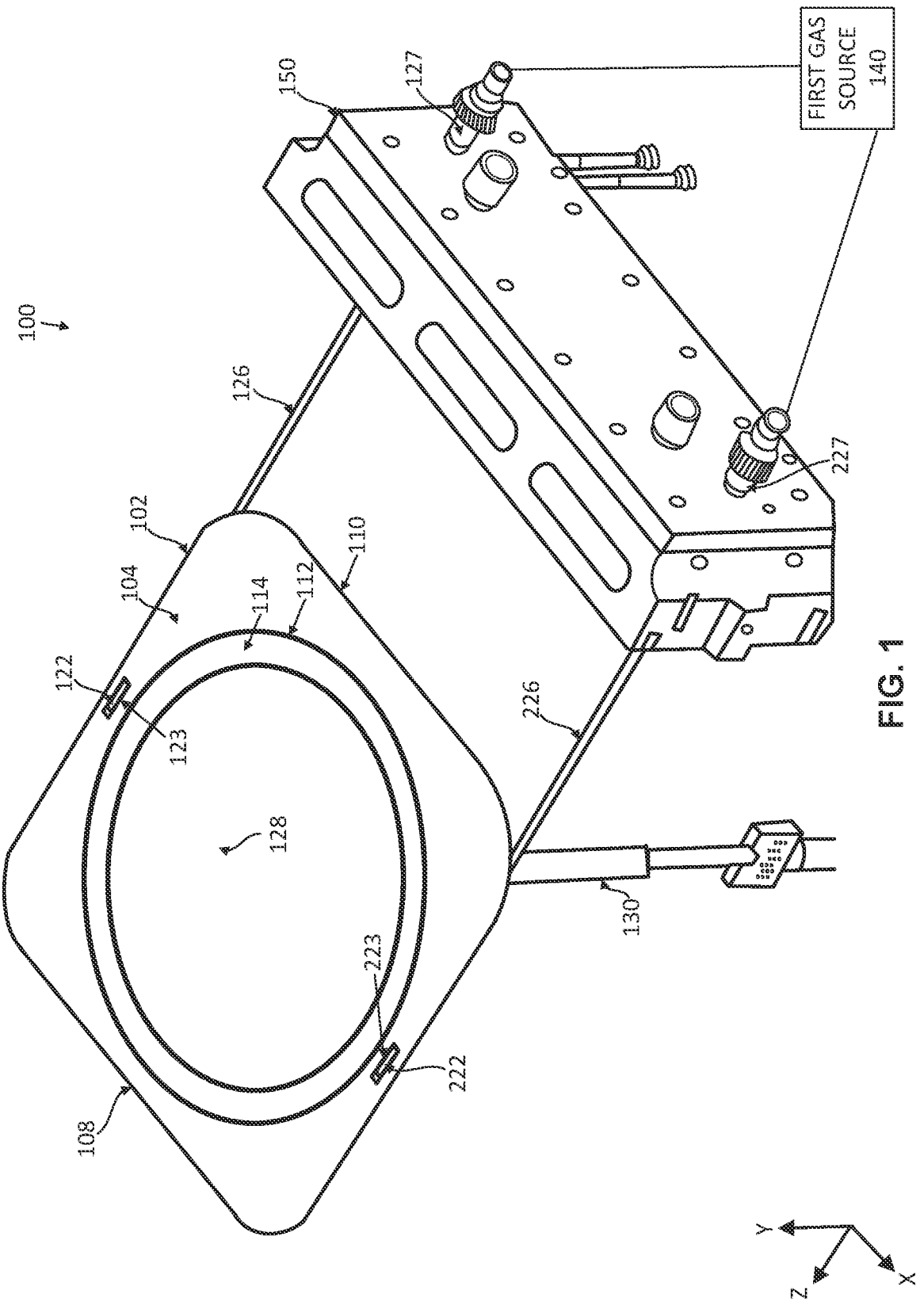
FIG. 1 illustrate an isometric view of a susceptor ring assembly in accordance with exemplary embodiments of the disclosure.
Figure 2:
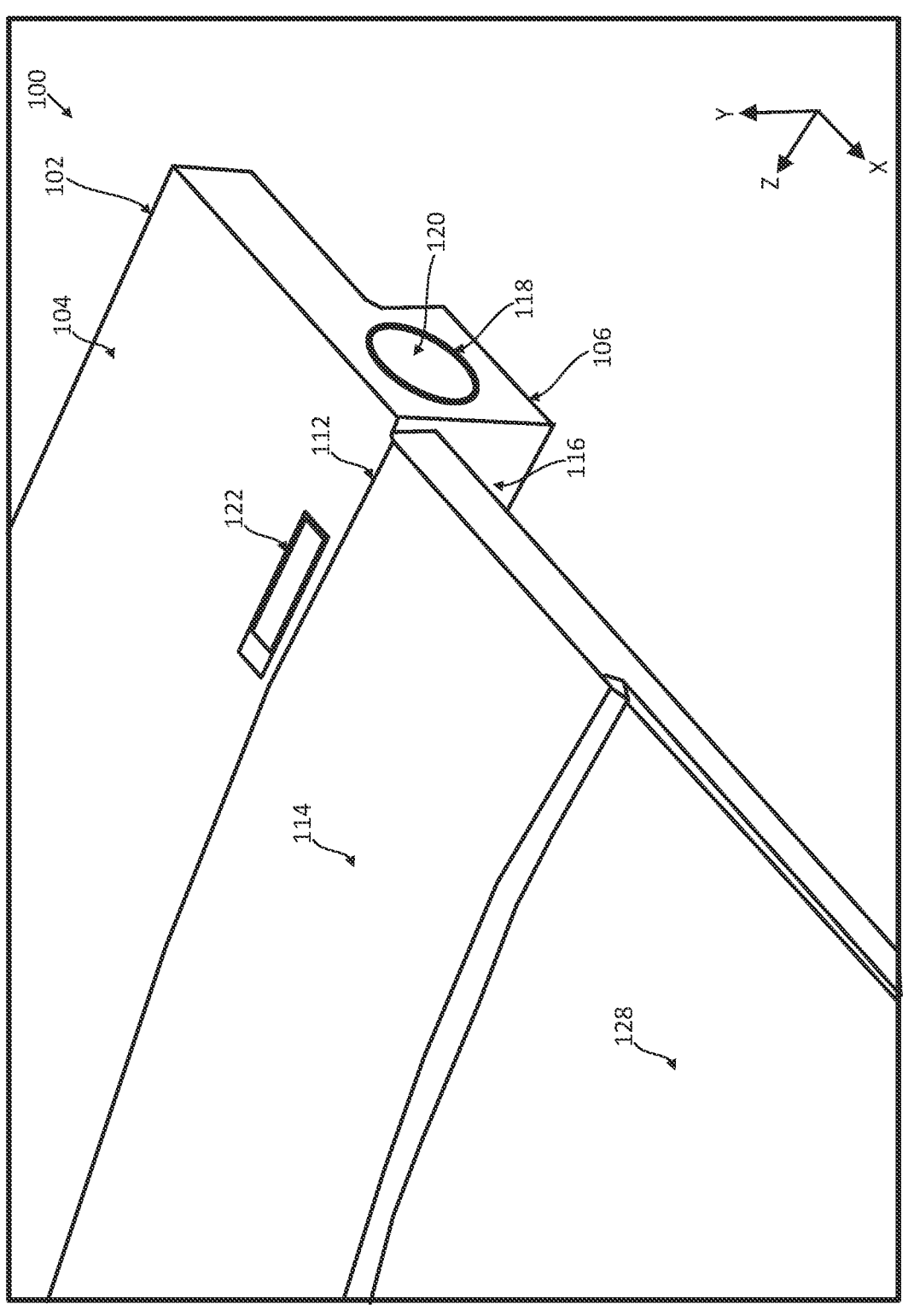
FIG. 2 illustrates a portion of a susceptor ring assembly in accordance with exemplary embodiments of the disclosure.

It will be appreciated that elements in the figures are illustrated for simplicity and clarity and have not necessarily been drawn to scale. For example, the dimensions of some of the elements in the figures can be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods, assemblies and systems suitable for use in gas-phase reactors. Such methods, assemblies, and systems can be used to form layers, such as epitaxial layers, during formation of devices. By way of examples, the methods, assemblies, and systems can be used to form epitaxial layers (e.g. multi-component) epitaxial layers with desired composition and/or thickness profiles, with improved control of such properties at or near an edge of the substrate.

As used herein, the terms "precursor" and/or "reactant" can refer to one or more gases/vapors that take part in a chemical reaction or from which a gas-phase substance that takes part in a reaction is derived. The terms precursor and reactant can be used interchangeably. The chemical reaction can take place in the gas phase and/or between a gas phase and a surface (e.g., of a substrate or reaction chamber) and/or a species on a surface (e.g., of a substrate or a reaction chamber). A dopant can be considered a precursor or reactant.

As used herein, the term "substrate" can refer to any underlying material or materials that can be used to form, or upon which, a device, a circuit, or a film can be formed by means of a method according to an embodiment of the present disclosure. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may comprise, or may consist at least partially of, a plurality of dispersed atoms on a surface of a substrate and/or may be or may become embedded in a substrate. A film or layer may comprise material or a layer with pinholes and/or isolated islands. A film or layer may be at least partially continuous. In some cases, a film can include two or more layers.

As used herein, a "structure" can be or can include a substrate as described herein. Structures can include one or more layers overlying the substrate, such as one or more layers formed according to a method as described herein.

The term "deposition process" as used herein can refer to the introduction of precursors (and/or reactants) into a reaction chamber to deposit or form a layer over a substrate.

In this disclosure, any two numbers of a variable can constitute a workable range of the variable, and any ranges indicated can include or exclude the endpoints. Additionally, any values of variables indicated (regardless of whether they are indicated with "about" or not) can refer to precise values or approximate values and include equivalents, and can refer to average, median, representative, majority, etc. in some embodiments. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Turning now to the figures, FIGS. 1-2 and 4-5 illustrate different views of a susceptor ring assembly 100 according to embodiments of the present disclosure. The susceptor ring assembly 100 comprises a susceptor ring 102 and one or more injector tubes 126, 226. In the illustrated example, the susceptor ring 102 includes a top surface 104, a bottom surface 106 (shown in FIG. 2), a first edge 108, a second edge 110 and a susceptor opening 112 at an interior of the susceptor ring 102. The susceptor opening 112 can be a circular opening centered within the susceptor ring 102. In various embodiments, a susceptor 114 can be at least partially disposed within the susceptor opening 112. Susceptor ring 102 can include an interior wall 116 as further illustrated, extending along the circumference of the susceptor opening from the top surface 104 to the bottom surface 106. Susceptor ring 102 can be formed of, for example graphite or pyrolytic carbon. The bulk graphite or pyrolytic carbon may be coated (or encapsulated) in silicon carbide.

Susceptor 114 is configured to receive and retain a substrate 128. A far edge of the substrate 128 can be defined as the outer 10% of the radius of the substrate. For example, if the radius of substrate 128 is 150 millimeters, then the far edge of substrate 128 can be defined as the area within the last (i.e., outmost) 15 millimeters of a radius of the substrate. In some cases the far edge can be defined as an area between the outer about 5% and about 15% of the radius of the substrate 128. Film thickness variation, known as roll-up or roll-down, can occur at the far edge of the substrate due to temperature differential during deposition between the center and the edge of the substrate during deposition on an upper surface of substrate 128.

Susceptor ring assembly 100 further comprises a first opening 118 that extends to a first injector cavity 120. First injector cavity 120 can extend from first edge 108 to a distance from first edge 108. For example, first injector cavity 120 can extend from about 30 millimeters to about 250 millimeters from first edge 108.

Figure 4:
FIG. 4 illustrates a cross sectional view of a susceptor ring assembly in accordance with exemplary embodiments of the disclosure.

The top surface 104 comprises a first injector port 122 which extends from the top surface 104 to the first injector cavity 120 at a first injection angle. The first injection angle ($\alpha$) can be defined as an angle between a first wall 124 of first injector port 122 and a plane parallel to top surface 104, as illustrated in FIG. 4. In various embodiments, the first injection angle $\alpha$ can be between about 25 degrees and about 65 degrees, between about 30 degrees and about 60 degrees, or between about 35 degrees and about 55 degrees. The first injector cavity 120 is configured to deliver a first gas to a reaction space through the first injector port 122. A first injector tube 126 can be disposed within the first injector cavity 120 and the first injector tube 126 can be in fluid communication with the first injector port 122 such that gas delivered from the first injector tube 126 can be delivered through the first injector port 122 and to the reaction space. In various embodiments, the first injector tube 126 comprises quartz or other suitable materials for gas deposition.

Figure 5:
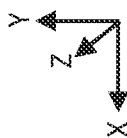
FIG. 5 illustrates a cross sectional view of a susceptor ring assembly in accordance with exemplary embodiments of the disclosure.

With additional reference to FIG. 5, the susceptor ring assembly 100 can include a second opening 218 that extends to a second injector cavity 220. In such cases, the top surface 104 can include a second injector port 222, which extends from the top surface 104 to the second injector cavity 220 at a second injection angle ($\beta$). The second injection angle can be defined as the angle between a second wall 224 and a plane parallel to top surface 104, as illustrated in FIG. 5. In various embodiments, the second injection angle $\beta$ can be between about 25 degrees and about 65 degrees, between about 30 degrees and about 60 degrees, or between about 35 degrees and about 55 degrees. The second injector cavity 220 is configured to deliver a gas (e.g. a second gas) to the reaction space through the second injector port 222. The first gas and the second gas can be the same gas or different gasses and can be referred to generally herein simply as gas. A second injector tube 226 can be disposed within the second injector cavity 220 and the second injector tube 226 can be in fluid communication with the second injector port 222. In various embodiments, the second injector tube 226 comprises quartz or other suitable materials for gas deposition.

Although illustrated with two injector tubes 126 and 226, assemblies, such as susceptor ring assembly 100, in accordance with the disclosure can include any suitable number of injector tubes.

In exemplary embodiments, a proximal portion 127 of the first injector tube 126 and a proximal portion 227 of the second injector tube 226 are both (e.g. sealably) coupled to an exhaust flange 150. A first gas source 140 can be in fluid communication with the proximal portion 127 of the first injector tube 126 and the proximal portion 227 of the second injector tube 226. The first gas source 140 can comprise one or more of the first gas and the second gas and deliver said gases to the injector tubes. In some embodiments, at least one of the first gas and the second gas comprises a precursor. The precursor may comprise a silane, such as, for example, silane ($SiH_4$), disilane ($Si_2H_6$), trisilane ($Si_3H_8$), tetrasilane ($Si_4H_{10}$) or higher order silanes with the general empirical formula $Si_xH_{(2x+2)}$. In some cases, the precursor can be a halogenated precursor. By way of examples, the precursor can be or include one or more of silicon tetrachloride ($SiCl_4$), trichloro-silane ($SiCl_3H$), dichlorosilane ($SiCl_2H_2$), monochlorosilane ($SiClH_3$), hexachlorodisilane (HCDS), octachlorotrisilane (OCTS), a silicon iodide, a silicon bromide. In some cases, the precursor can be an amino-based precursor, such as hexakis(ethylamino)disilane (AHEAD) and $SiH[N(CH_3)_2]_3$ (3DMASi), a bis(dialkylamino)silane, such as BDEAS (bis(diethylamino)silane); a mono(alkylamino)silane, such as di-isopropylaminosilane; or an oxysilane based precursor, such as tetraethoxysilane $Si(OC_2H_5)_4$.

Additionally or alternatively, one or more of the first gas and the second gas can comprise a carrier gas, such as an inert gas. In some cases, one or more of the first gas and the second gas can include a dopant. Exemplary dopant sources include gases that include one or more of arsenic (As), phosphorus (P), carbon (C), germanium (Ge), and boron (B). By way of examples, the dopant source can include germane, diborane, phosphine, arsine, or phosphorus trichloride.

In various embodiments, the susceptor 114 can also be configured to rotate (or not) during processing by a rotational motor system 130 coupled to the susceptor 114. In accordance with examples of the disclosure, susceptor rotates at a speed of about 60 to about 2, about 35 to about 2, or about 35 to about 15 rotations per minute.

In some cases, the first injector port 122 has a first injector port length 123 between about 5 millimeters and about 20 millimeters, or between about 8 millimeters and about 15 millimeters, or about 10 millimeters. The second injector port 222 can have a second injector port length 223 between about 5 millimeters and about 20 millimeters, or between about 8 millimeters and about 15 millimeters, or about 10 millimeters. A cross-sectional dimension of the first and/or second injector port can be between about 5 millimeters and about 20 millimeters. The dimensions, and/or the angles of the injector ports can be tuned to provide desired flow characteristic for gas injection to the substrate 128. The first injector port 122 and the second injector port 222 can be configured to deliver substantially radial flow of gases to the substrate 128 by providing the first and/or second gas at an area about equal distant (e.g. within about 10%, 5% or 2%) of a location midway between a leading or distal edge of the substrate and a trailing or proximal edge of the substrate and outside (away) from the perimeter of the substrate. In various embodiments, the first injector port 122 and/or second injector port 222 is between about 20 millimeters and about 30 millimeters, or between about 25 millimeters and 28 millimeters away from an outer edge the substrate 128.

Figure 3:
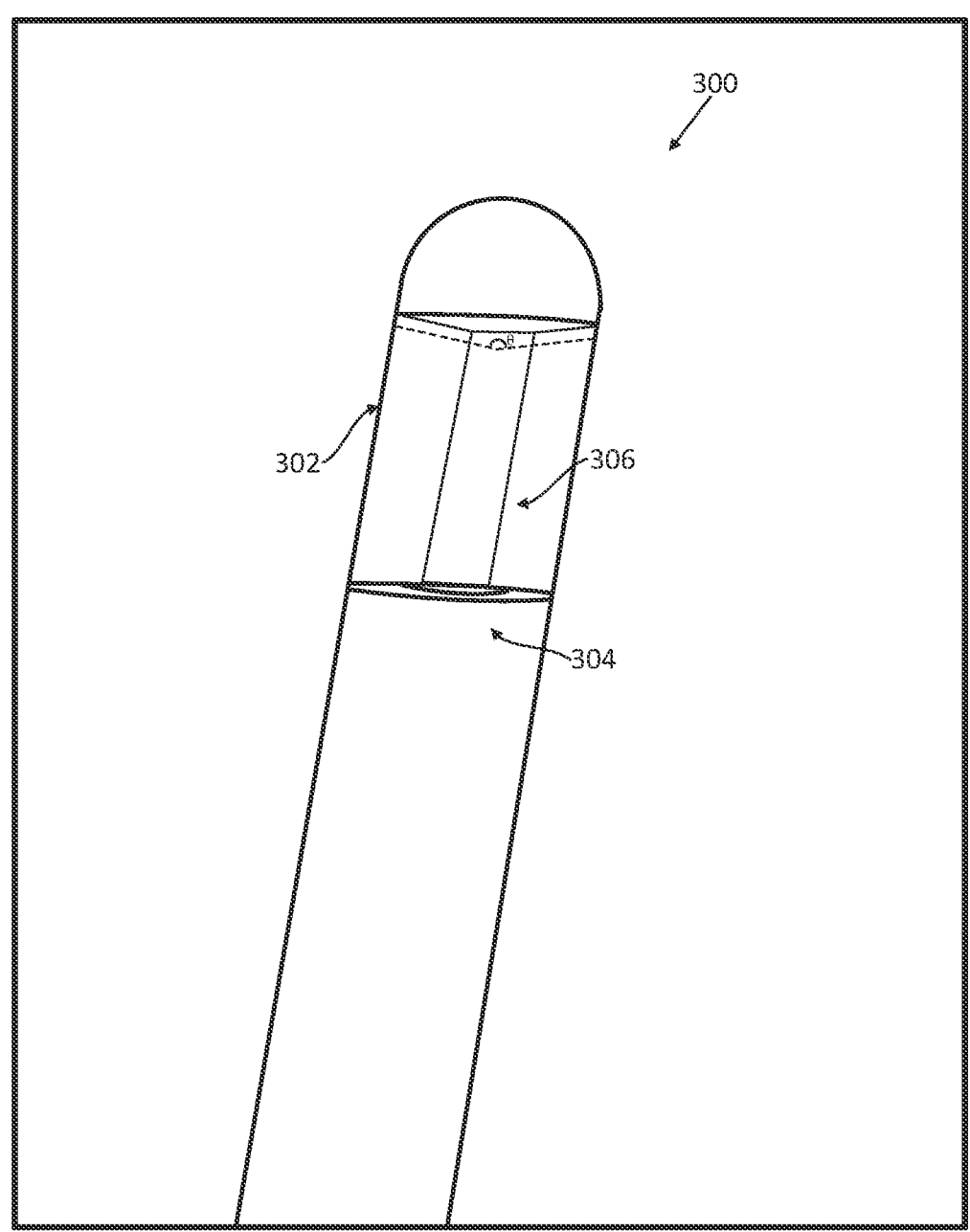
FIG. 3 illustrates a portion of an injector tube in accordance with exemplary embodiments of the disclosure.

With additional reference to FIG. 3, a portion of an exemplary injector tube 300 is illustrated. Injector tube 300 can be used for one or more of the first injector tube 126 and the second injector tube 226. Injector tube 300 comprises an aperture 302 within a wall 304 of the injector tube 300. In the illustrated example, the aperture 302 is cut out of the injector tube 300 such that there is an opening angle ($\theta$) 306. The first injector tube 126 comprises a first aperture 160 within a wall of the injector tube 162. The second injector tube 226 comprises a second aperture 260 within a wall of the injector tube 262. Both the first aperture 160 and the second aperture 260 have an opening angle $\theta$ of between about 120 degrees and bout 70 degrees, or about 80 degrees and about 100 degrees, or about 90 degrees. In various embodiments, one or more of the first opening angle and the second opening angle are greater than the respective first injection angle $\alpha$ and the second injection angle $\beta$.

Figure 6:
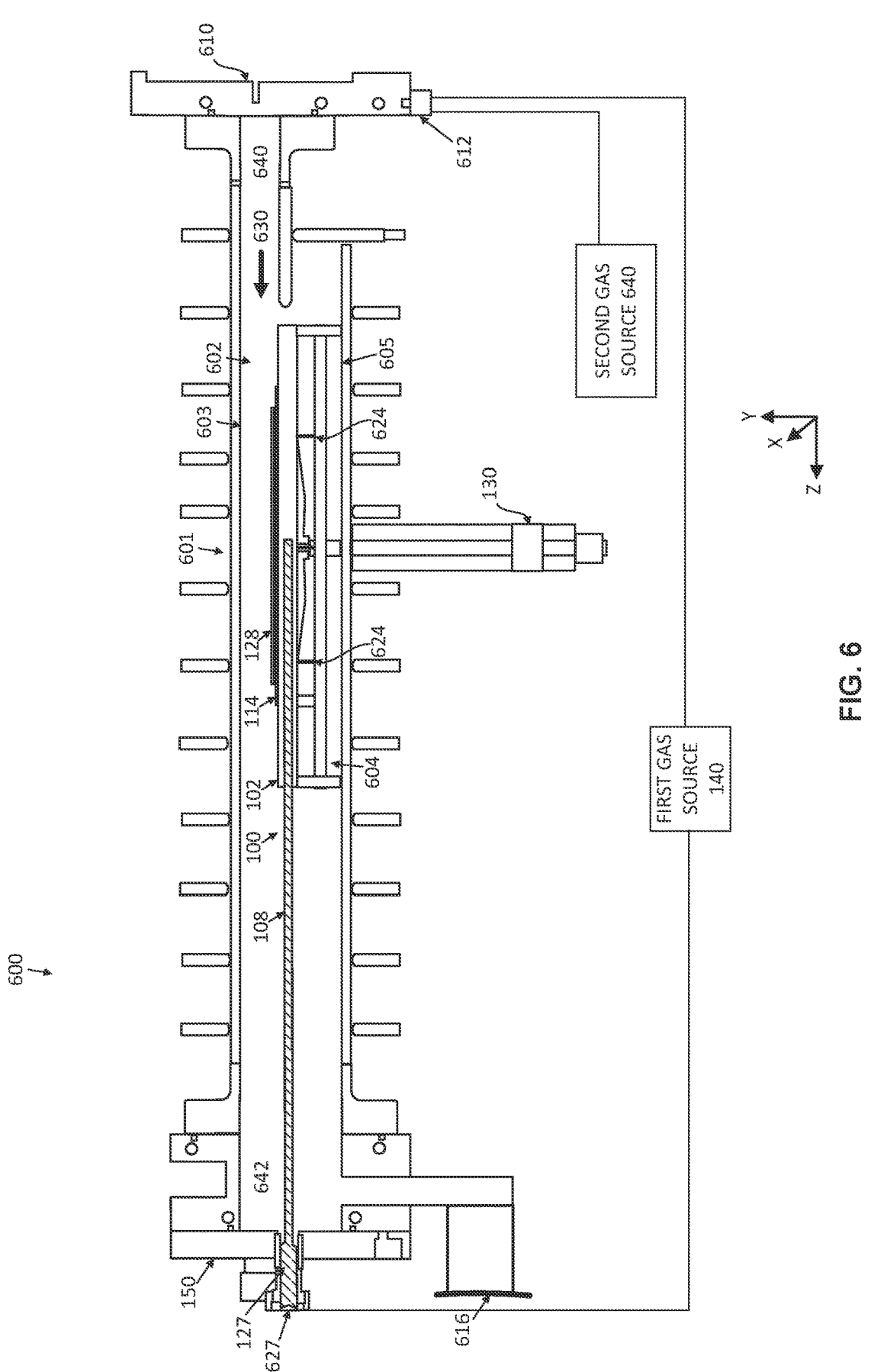
FIG. 6 illustrates a cross sectional view of a reactor system in accordance with exemplary embodiments of the disclosure.

With reference to FIG. 6, a cross-section view of an exemplary reactor system 600 according to an embodiment of the present disclosure is illustrated. The reactor system 600 can comprise a reaction chamber 601 with a first end 640 of the reaction chamber 601 comprising an injection flange 610, and a second end 642 of the reaction chamber 601 comprising an exhaust flange 150. The reaction chamber 601 further comprises a reaction chamber upper wall 603 and a reaction chamber lower wall 605. The reactor system 600 comprises the susceptor ring assembly 100 as described above. The reaction chamber 601 comprises an upper chamber area 602 defined as the volume between the susceptor ring 102 and the reaction chamber upper wall 603. Further, the reaction chamber 601 comprises a lower chamber area 604 defined as the volume between the susceptor ring 102 and the reaction chamber lower wall 605.

The substrate 128 can be provided in the reaction chamber 601 on the susceptor 114. In various embodiments, the substrate 128 can be lifted above the susceptor and lowered on to the susceptor 114 for processing with one or more lift pins 624. In various embodiments, an exhaust port 616 is fluidly coupled at the second end 642 of the reaction chamber 601 to remove process gases and precursors from the reaction chamber.

The injection flange 610 can comprise a gas inlet 612 configured to introduce gas (e.g. the first and second gas) to the reactor system through the injection flange 610 into the first end 640 of the reaction chamber 601. The gas inlet 612 is in fluid communication with the first gas source 140 and optionally a second gas source 650. Both the first and second gas sources can comprise any of the precursors, carrier gases, dopants, mixtures thereof, or the like as described above. A gas inlet of the first injector tube 627 and a gas inlet of the second injector tube can be at the second end 642 of the reaction chamber 601, wherein the gas inlets of the injector tubes are in fluid communication with the first gas source 140, such as the first gas source 140 and/or the second gas source 650.

A gas flow 630 represents the flow direction of the gas entering the reaction chamber at the first end 640 of the reaction chamber 601. The gas entering the reaction chamber from the first injector port 122 and the second injector port 222 is a far edge gas flow. In various embodiments, the far edge gas flow entering the reaction chamber from the first injector port 122 and the second injector port 222 is substantially perpendicular (e.g. about 90 degrees plus/minus 10 degrees, 5 degrees or 2 degrees) to the gas flow 630 and substantially remains in the upper chamber area 602.

Figure 8:
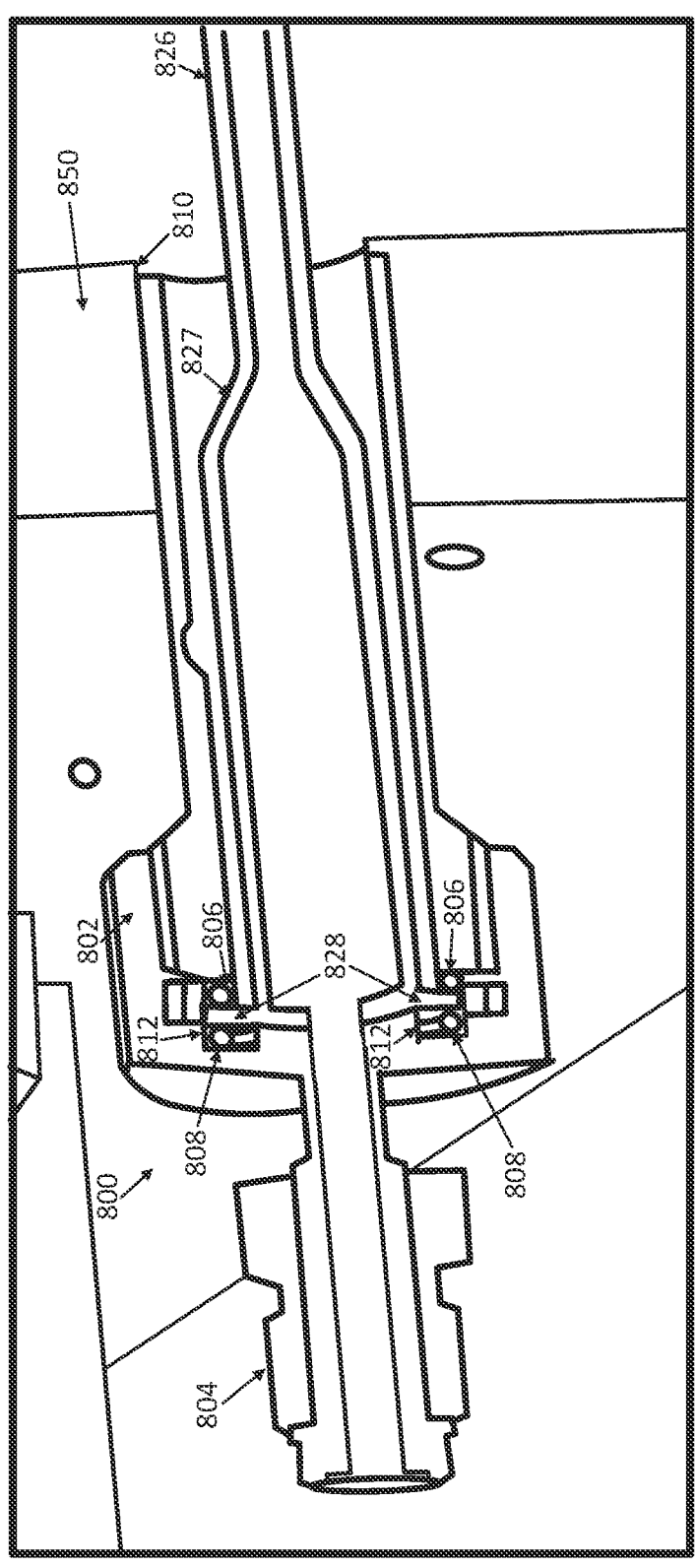
FIG. 8 illustrates a portion of a gas inlet in accordance with exemplary embodiments of the disclosure.

With reference to FIG. 8, a portion of an exemplary gas connector assembly 800 is illustrated. Gas connector assembly 800 can be used to couple an injector tube 826 (same or similar to first injector tube 126 and the second injector tube 226) to an exhaust flange 850 (same or similar to exhaust flange 150). Gas connector assembly 800 comprises a nut 802 coupled to an exhaust flange opening 810 of the exhaust flange 850 and a portion of the nut 802 is disposed on the outside of the exhaust flange 850. The nut 802 can comprise connector cavity 812 at a distal end of the nut 802. In various embodiments, the injector tube 826 can also comprise a proximal portion 827 (same similar to proximal portions 127 and 227) of the injector tube 826. The proximal portion 827 of the injector tube 826 has an increased diameter when compared with the rest of the injector tube 826. The proximal portion 827 of the injector tube 826 can be completely encased by the nut 802 and the exhaust flange 850.

Additionally, the injector tube 826 can comprise a tube flange 828 at the end of the proximal portion 827 of the injector tube 826, the tube flange 828 can comprise a lip that wraps around the end of the proximal portion 827 of the injector tube 826. Injector tube 826 can be coupled to the nut 802 by placing the tube flange 828 into the connector cavity 812 and compressing the sides of the tube flange 828 with a first o-ring 806 and a second o-ring 808 placed between the connector cavity 812 and each side of the tube flange 828. The o-rings 806, 808 put pressure against the tube flange 828 to secure the tube flange 828 and the injector tube 826 in place.

The gas connector assembly 800 can further comprise a VCR connector 804 coupled to the nut 802. In some embodiments the VCR connector 804 is welded to the nut 802. The VCR connector can be in fluid communication with a gas source, such as the first gas source 140, and the proximal portion 827 of the injector tube 826. The gas connector assembly 800 can be used in FIG. 1 to secure each of the proximal portions 127 and 227 of the injector tubes 126 and 226 to the exhaust flange 150.

Figure 7:
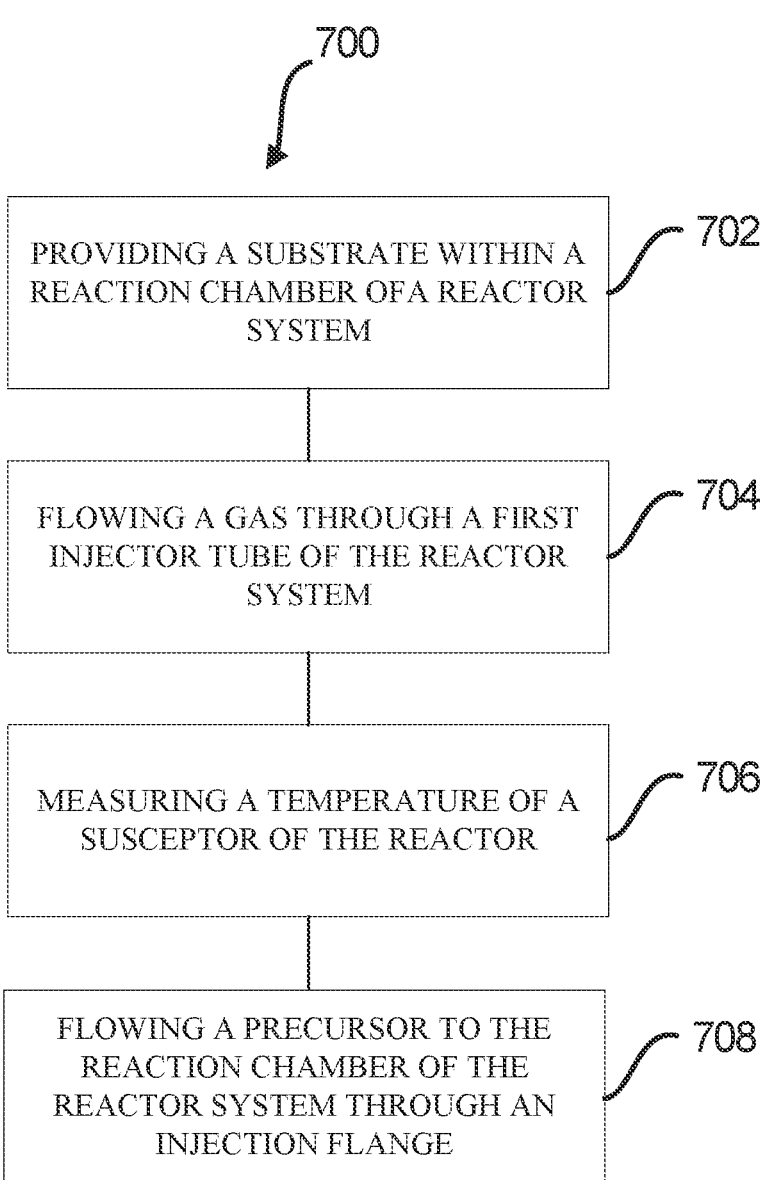
FIG. 7 illustrates a method in accordance with exemplary embodiments of the disclosure.

With reference to FIG. 7, a method 700 according to embodiments of the disclosure is illustrated. Method 700 includes a step 702 of providing a substrate (such as substrate 128) within a reaction chamber (such as reaction chamber 601) of a reactor system (such as reactor system 600).

Method 700 includes a step 704, which can involve flowing a gas through at least one injector tube (e.g., a first injector tube (such as first injector tube 126) and/or a second injector tube (such as second injector tube 226) of the assembly 100 or the reactor system 600. During step 704, the reaction chamber 601 temperature can be about 350° C. to about 950° C., about 350° C. to about 800° C., or about 600° C. to about 800° C. A pressure within the reaction chamber can be about 2 Torr to about 1 ATM, about 2 Torr to about 400 Torr, or about 2 Torr to about 200 Torr. A flowrate of the first gas (e.g. a silicon-containing precursor) can be about 10 sccm to about 700 sccm, or 10 sccm to about 300 sccm; a flowrate of a second gas (e.g. a germanium-containing precursor) can be about 10 sccm to about 990 sccm, about 10 sccm to about 220 sccm, or about 10 sccm to about 85 sccm; either or which flowrates can be with or without a carrier gas.

The gas in step 704 is provided to the first injector tube 126 and/or second injector tube from a gas source (such as first gas source 140 and/or second gas source 650) and can comprise a precursor or any of the other gases as described above. In various embodiments, the precursor comprises silicon. The gas can be configured to flow from the first injector tube 126 to the first injector port 122 and exit the first injector port 122 radially towards the substrate 128.

In additional embodiments, the step 704 can include flowing a first gas and/or a second gas through a second injector tube (such as second injector tube 226). The gas flowing through the second injector tube 226 can be the same gas or a different gas than the gas flowed through the first injector tube 126. For example, the first gas can include a mixture of gases, such as a silicon-containing precursor, a germanium-containing precursor, a dopant-containing precursor, and/or an etchant as described above.

In some cases, a gas provided to the first and/or second injector tubes 126, 226 can include the same gas(es). In some cases, a gas provided to the first and/or second injector tubes 126, 226 can be the same gas provided to an injection flange. In some cases, the gas provided to the first and/or second injector tubes 126, 226 can include different mixture ratio of the same gases or a subset of gases, of the gases provided to the inlet flange, or can be or include another (e.g. inert) gas.

In further embodiments, the gas can be provided to the first injector port 122 and the second injector port 221 independently of each other—or not. In other words, in some cases, a flow rate of the first and second gases can be independently controlled and/or can originate from different sources. Step 704 can involve controlling a flowrate or relative flowrates of the gases for a desired profile. If a roll-down at the far edge is desired, then the reactor system 600 can increase a flowrate of a precursor at one or more of the first injector port 122 and the second injector port 222. If a roll-up at the far edge is desired, then the reactor system 600 can increase a flowrate of a carrier gas at one or more of the first injector port 122 and the second injector port 222 to dilute any precursor in the reaction chamber 601. The flow rate of the first and second gases can similarly be controlled to obtain desired film thickness and/or composition profiles. The thickness and composition profiles can be controlled using methods disclosed herein.

Method 700 includes a step 706, which can involve measuring a temperature of a susceptor (such as susceptor 114). The temperature can be measured using one or more thermocouples disposed within the susceptor 114 and/or by using a pyrometer. Measuring the temperature of the susceptor can help in determining a temperature profile and a temperature differential along the substrate 128. As previously discussed above, film thickness variation (e.g. film roll-up or roll-down at the far edge of the substrate) can be caused by the temperature differential during the deposition process Method 700 includes a step 708, which can involve flowing a precursor to the reaction chamber 601 of the reactor system 600 through an injection flange (such as injection flange 610). In various embodiments, the precursor flowing through the injection flange 610 can be provided from the second gas source 650 and the same precursor or a different precursor can flow through the first injector port 122 from the first gas source 140 during this step.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A susceptor ring assembly comprising:
a susceptor ring comprising a top surface, a bottom surface, a first edge, a second edge, and a susceptor opening at the interior of the susceptor ring, wherein the first edge comprises an opening extending to a first injector cavity within the susceptor ring, wherein the top surface comprises a first injector port extending from the top surface to the first injector cavity at a first injection angle, and wherein the susceptor opening spans between the top surface and the bottom surface; and
a first injector tube at least partially disposed within the first injector cavity.

2. The susceptor ring assembly of claim 1, wherein the first injector tube comprises quartz.

3. The susceptor ring assembly of claim 1, wherein the susceptor ring comprises a second injector cavity, and wherein the susceptor ring assembly comprises a second injector tube disposed therein.

4. The susceptor ring assembly of claim 1, wherein the first injection angle is between about 25 degrees and about 65 degrees.

5. The susceptor ring assembly of claim 1, wherein the first injector port has a first injector port length between about 5 millimeters and about 20 millimeters.

6. The susceptor ring assembly of claim 1, further comprising a rotatable susceptor at least partially disposed within the susceptor opening.

7. The susceptor ring assembly of claim 1, wherein the first injector tube comprises a first aperture within a wall of the first injector tube.

8. The susceptor ring assembly of claim 7, wherein the first aperture is in fluid communication with the first injector port.

9. The susceptor ring assembly of claim 1, wherein an opening angle of the first aperture is greater than the first injection angle.

10. A reactor system comprising:

a reactor comprising a reaction chamber; and a susceptor ring assembly disposed within the reactor, the susceptor ring assembly comprising:

a susceptor ring comprising a top surface, a bottom surface, a first edge, a second edge, and a susceptor opening at the interior of the susceptor ring, wherein the first edge comprises an opening extending to a first injector cavity, wherein the top surface comprises a first injector port extending from the top surface to the first injector cavity at a first injection angle, and wherein the susceptor opening spans between the top surface and the bottom surface; and a first injector tube at least partially disposed within the first injector cavity; and a rotatable susceptor at least partially disposed within the susceptor opening.

11. The reactor system of claim 10, wherein the reactor system further comprises a thermocouple disposed within the rotatable susceptor.

12. The reactor system of claim 10, wherein the reactor system further comprises an exhaust flange, and wherein a proximal portion of the first injector tube is disposed within the exhaust flange.

13. The reactor system of claim 10, wherein the first injector tube comprises quartz.

14. The reactor system of claim 10, further comprising an injection flange, wherein the injection flange introduces gas at a first end of a reaction chamber or the reactor and wherein a gas inlet of the first injector tube is at a second end of the reaction chamber.

15. The reactor system of claim 10, comprising a plurality of injector ports.

16. The reactor system of claim 10, wherein the first injector tube comprises a first aperture configured to provide gas substantially perpendicular to a flow of a process gas flowing from a reaction chamber inlet to a reaction chamber outlet.

17. The reactor system of claim 16, wherein the first aperture is in fluid communication with the first injector port.

18. The reactor system of claim 10, wherein the reactor system further comprises a precursor source in fluid communication with the injection flange and the first injector port for introduction of a precursor to the reaction chamber.

19. A method, comprising the steps of:

providing a substrate within a reaction chamber of a reactor system, wherein the reactor system comprises a susceptor ring assembly comprising:

a susceptor ring comprising a top surface, a bottom surface, a first edge, a second edge, and a susceptor opening at the interior of the susceptor ring, wherein the first edge comprises an opening extending to a first injector cavity within the susceptor ring, wherein the top surface comprises a first injector port extending from the top surface to the first injector cavity at a first injection angle, and wherein the susceptor opening spans between the top surface and the bottom surface; and a first injector tube at least partially disposed within the first injector cavity; and flowing a gas through the first injector tube.

20. The method of claim 19, wherein the reactor system further comprises a thermocouple disposed within a susceptor, and the method further comprises measuring a temperature of the susceptor.

21. The method of claim 20, wherein the method further comprises controlling a flowrate of gas within the first injector tube.

22. The method of claim 19, wherein the gas is one or more of a silicon-containing precursor, a germanium-containing precursor, and a dopant containing precursor.

23. The method of claim 19, wherein the reactor system further comprises a precursor source in fluid communication with the injection flange and the first injector port for introduction of a precursor to the reaction chamber, and wherein the method further comprises flowing a precursor into the reaction chamber through the injection flange and the injector port.

* * * * *